United States Patent
Anderson et al.

(10) Patent No.: US 11,067,747 B2
(45) Date of Patent: Jul. 20, 2021

(54) DEPOSITED SI PHOTODETECTORS FOR SILICON NITRIDE WAVEGUIDE BASED OPTICAL INTERPOSER

(71) Applicant: Cisco Technology, Inc., San Jose, CA (US)

(72) Inventors: Sean P. Anderson, Macungie, PA (US); Vipulkumar Patel, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/662,639

(22) Filed: Jul. 28, 2017

(65) Prior Publication Data
US 2019/0033518 A1 Jan. 31, 2019

(51) Int. Cl.
G02B 6/12 (2006.01)
G02B 6/122 (2006.01)
H01L 31/105 (2006.01)
H01L 31/0232 (2014.01)

(52) U.S. Cl.
CPC ..... *G02B 6/12002* (2013.01); *G02B 6/12004* (2013.01); *G02B 6/1228* (2013.01); *H01L 31/02327* (2013.01); *H01L 31/105* (2013.01); G02B 2006/12123 (2013.01)

(58) Field of Classification Search
CPC .......... G02B 6/12002; G02B 6/1228; G02B 2006/12123; G02B 6/12004; G02B 2006/12061; H01L 31/02327; H01L 31/105
See application file for complete search history.

(56) References Cited

U.S. PATENT DOCUMENTS

| | | | |
|---|---|---|---|
| 7,343,061 B2 * | 3/2008 | Forrest | G02B 6/12004 372/50.21 |
| 8,757,897 B2 | 6/2014 | Kosenko et al. | |
| 9,036,955 B2 | 5/2015 | Bowen et al. | |
| 2004/0179806 A1 * | 9/2004 | Block | G02B 6/12004 385/146 |
| 2009/0041406 A1 * | 2/2009 | Schulz | H01L 31/0232 385/14 |
| 2011/0032685 A1 | 2/2011 | Akiba et al. | |
| 2012/0235265 A1 * | 9/2012 | Takabayashi | H01L 31/105 257/432 |
| 2017/0025562 A1 * | 1/2017 | Knoll | G02B 6/42 |

* cited by examiner

*Primary Examiner* — Ryan A Lepisto
*Assistant Examiner* — Erin D Chiem
(74) *Attorney, Agent, or Firm* — Patterson + Sheridan, LLP

(57) ABSTRACT

Embodiments herein describe optical interposers that utilize waveguides to detect light. For example, in one embodiment, an apparatus is provided that includes an optical detector having a first layer. The first layer includes at least one of polysilicon or amorphous silicon. The first layer forms a diode that includes a p-doped region and an n-doped region. The apparatus further includes a waveguide optically coupled to the diode and disposed on a different layer than the first layer.

15 Claims, 6 Drawing Sheets

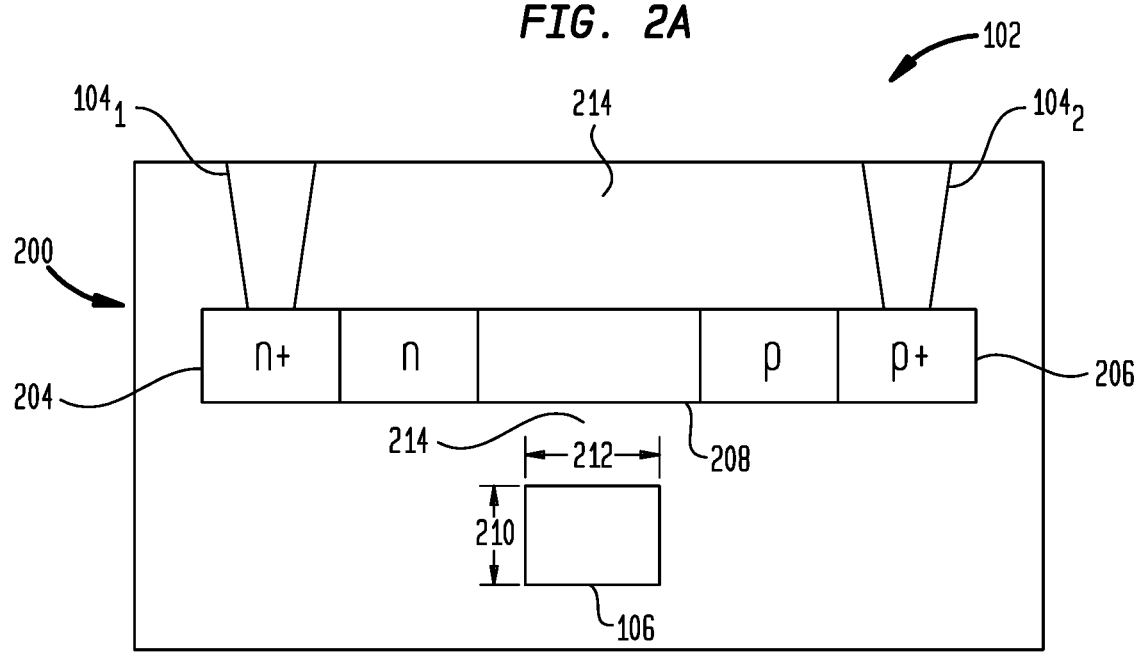
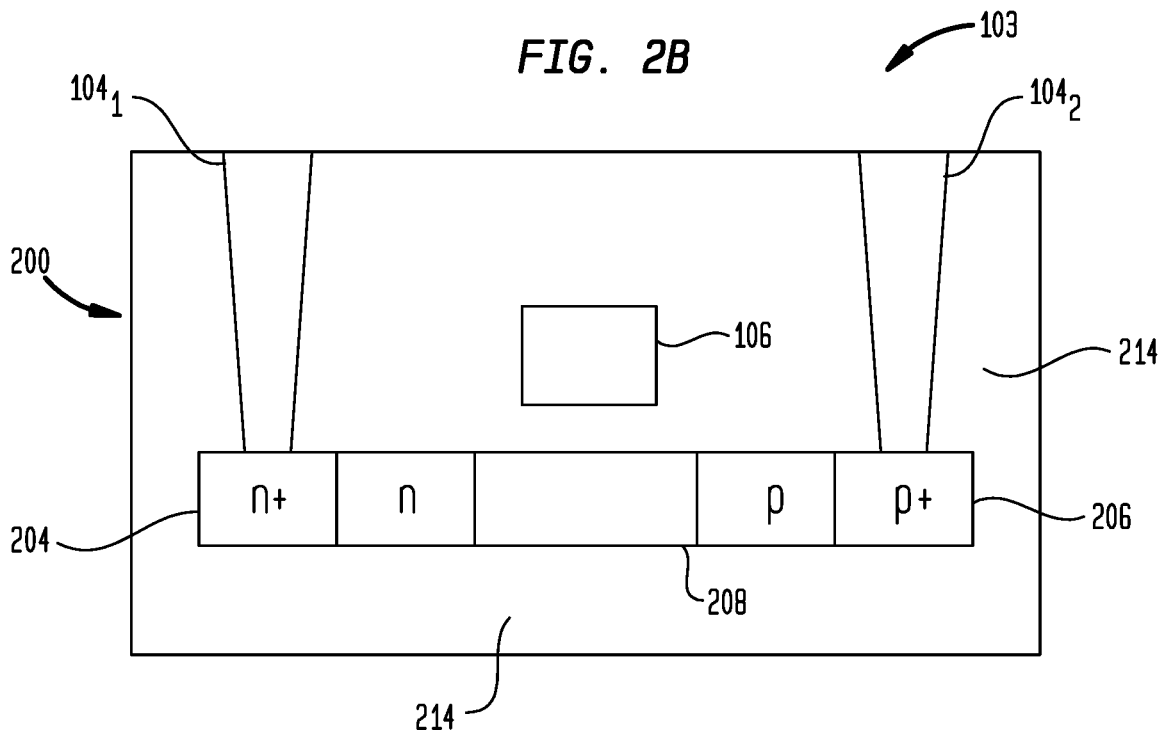

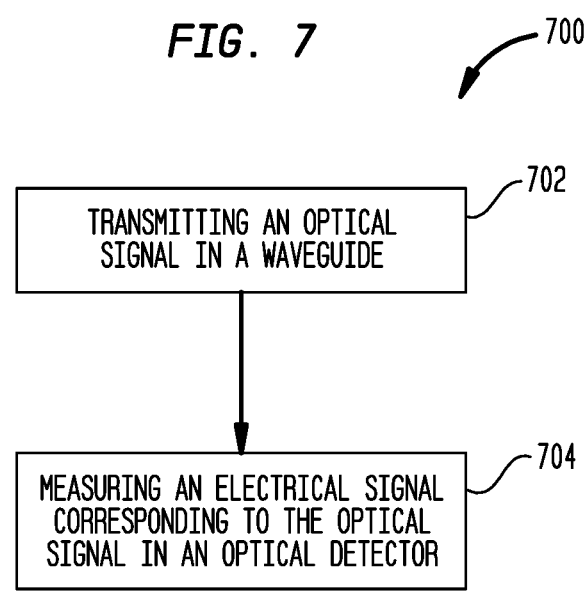

DEPOSITED SI PHOTODETECTORS FOR SILICON NITRIDE WAVEGUIDE BASED OPTICAL INTERPOSER

TECHNICAL FIELD

Embodiments presented in this disclosure generally relate to optical interposers and more specifically, to optical interposers that use waveguides formed from silicon and nitride to detect light in a doped polysilicon or amorphous silicon layer.

BACKGROUND

Fiber optic components are used in a wide variety of applications as a medium for transmission of digital data (including voice, internet and IP video data). Fiber optics is becoming increasingly more common due to high reliability and large bandwidths available with optical transmission systems. Interposers can function as substrates for optical, opto-electrical, and electrical components and provide interconnections to optically and/or electrically interconnect the optical/opto-electrical/electrical components. To measure an optical signal, a tap coupler is inserted near a waveguide to redirect a few percent of the optical energy from the waveguide into a separate optical port.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A illustrates a cross-sectional view of the optical detector depicted in FIG. 1, according to one embodiment disclosed herein.

FIG. 2B illustrates a cross-sectional view of an optical detector, according to one embodiment disclosed herein.

FIG. 7 illustrates a method of operation, according to one embodiment disclosed herein.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

One embodiment presented in this disclosure is an apparatus that includes an optical detector having a first layer. The first layer includes at least one of polysilicon or amorphous silicon. The first layer forms a diode that includes a p-doped region and an n-doped region. The apparatus further includes a waveguide optically coupled to the diode and disposed on a different layer than the first layer. In various embodiments, the waveguide is silicon nitride, silicon oxynitride, or a polymer.

In another embodiment, a method of operating an apparatus is provided that includes transmitting an optical signal through a waveguide that causes a corresponding electrical signal in an optically coupled first layer that has been doped to have a diode. The waveguide is on a different layer than the first layer and includes silicon and nitride. Thereafter, the method measures the corresponding electrical signal.

In yet another embodiment, an interposer is provided that includes an optical detector that includes a first layer that forms a diode. The interposer also includes a waveguide optically coupled to the diode and disposed on a different layer than the first layer. The waveguide is made of a material that includes one of silicon nitride or silicon oxynitride.

EXAMPLE EMBODIMENTS

Embodiments herein describe optical interposers that include optical detectors optically coupled to waveguides formed from silicon and nitride. In one embodiment, the optical interposer is an interface by receiving an optical signal and rerouting the optical signal to a different connection. The optical interface can convert the received optical signal into a corresponding electrical signal. In some embodiments the waveguides are made of silicon nitride. In other embodiments, the waveguides are made of silicon oxy-nitride. "Silicon nitride" and "silicon oxy-nitride" are used interchangeably in this document. One of the advantages of using silicon nitride or silicon oxy-nitride rather than silicon in the waveguides is that interposers based on these materials are less expensive. In addition, the interposers disclosed herein do not require an SOI or germanium ("Ge") layer and do not require the use of a separate "tap detector" to monitor light in the photodetector.

"Taper" as used herein is defined as diminishing or reducing dimension(s) of the waveguides described herein. The "near IR frequency range" is defined herein as relating to electromagnetic radiation having wavelengths between about 0.7 and 3.0 microns. "Responsivity" as used herein is defined as the electrical current output per the optical input of the photodetector.

Figure 1:
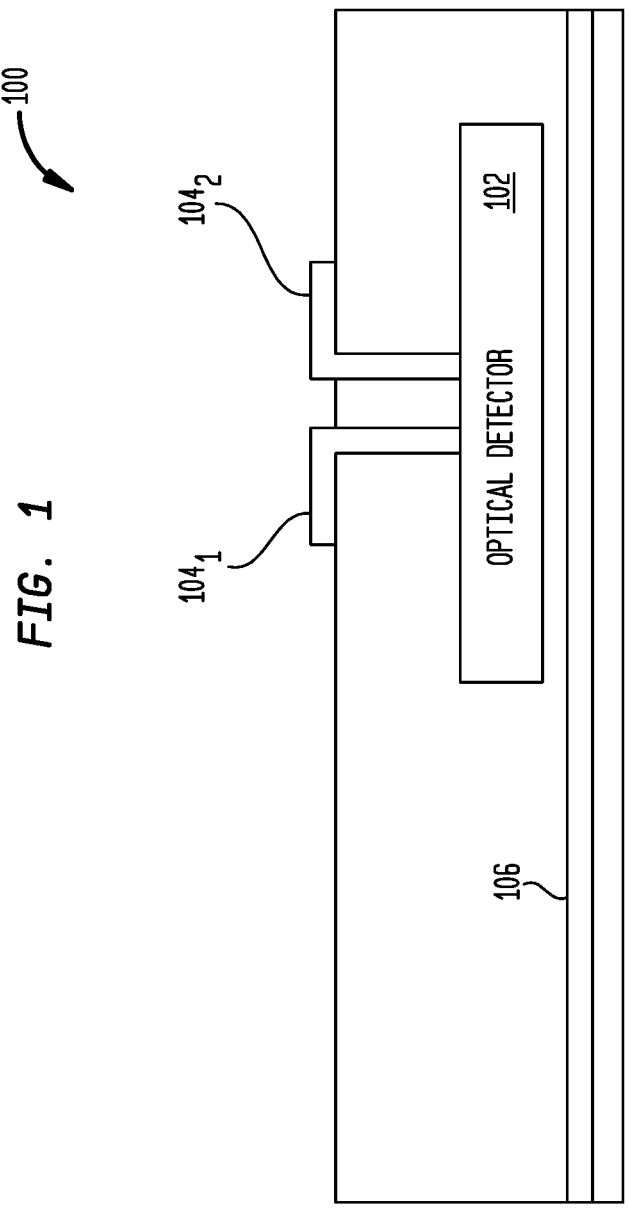
FIG. 1 illustrates an interposer that includes an optical detector, according to one embodiment disclosed herein.

FIG. 1 illustrates an interposer 100 that includes an optical detector 102, according to one embodiment disclosed herein. The optical detector 102 receives an optical signal from an optical waveguide 106. The optical detector 102 also includes electrical contacts $104_1$ and $104_2$ (collectively "electrical contacts 104"). The optical detector 102 converts the optical signal, received via the optical waveguide 106, into an electrical signal (e.g., a voltage or current) and transmits the electrical signal via electrical contacts 104 to electrical components (not shown). For example, the electrical contacts 104 can be coupled/connected to an electrical integrated chip ("IC"). The optical detector 102 can also receive electrical signals via the electrical contacts 104. For illustrative purposes only, the diodes have been described herein as "p-i-n diodes." However, other embodiments may use a pn diode that lacks an intrinsic area.

Silicon-nitride based optical interposers are increasingly used to simplify packaging, to reduce cost, and turn-around time. For example, a silicon-nitride interposer may not require a SOI or germanium ("Ge") layer which can reduce turn-around time. Integrated detectors are used for implementing control loops in silicon based photonic interposers, in order to facilitate fiber alignment, laser burn-in, and optical power level monitors, etc. The high concentration of defects (crystalline grain boundaries) inherent to polysilicon and amorphous silicon gives rise to defect states, which act as absorbers of light in the near-infrared wavelength range.

The optical detectors (e.g., optical detectors 102 and 103) can be implemented in "end-of-line" configuration using tap couplers or in an in-line configuration. One of the advantages of the "in-line" detector configuration is that it does not "tap" some percentage of the optical energy into a separate optical port and does not rely on adding an optical tap into the waveguide 106 it is monitoring. This minimizes both optical loss, and implementation complexity.

FIG. 2A illustrates a cross-sectional view of the optical detector 102 depicted in FIG. 1, according to one embodiment disclosed herein. In FIG. 2A, a first layer 200 that contains polysilicon or amorphous silicon has been doped to form a p-i-n diode that includes an n-doped region 204, a p-doped region 206 and an intrinsic region 208. Light transmitted in the waveguide 106 interacts with the intrinsic region 208. The high density of sub-band states in the first layer 200 leads to the creation of free charges in a concentration proportional to the light intensity. The p-i-n doping profile sweeps these charges to the contacts 104, where they can be extracted and sensed. In one embodiment, properties of the first layer 200 can be optimized for light detection utilizing annealing techniques used in polysilicon and amorphous silicon display fabrication technologies.

The first layer 200 includes two surfaces. One of those surfaces (also referred to herein as a "first surface") is connected to the electrical contacts 104. The first layer 200 also includes another surface (also referred to herein as a "second surface") that opposite is to the first surface and is substantially parallel to the first surface. The waveguide 106 is positioned in a facing relationship with the second surface of the first layer 200. The dimensions of the waveguide 106 are such that it has a single mode. For example, the waveguide 106 may include a thickness 210 of about 100 nm to about 500 nm and a width 212 of about 400 nm to about 4000 nm. Although the thickness 210 and the width 212 can be tapered, for illustrative purposes only examples are provided herein that taper the width 212 of the waveguide 106. The first and second surfaces of the first layer 200 are in contact with at least one layer of material 214 that has a different refractive index than either the polysilicon or the material composing the waveguide 106. Moreover, the material 214 surrounds the waveguide 106. In one embodiment, the material 214 is silicon dioxide. When an optical signal passes through the waveguide 106 some light radiates through the material 214 and into the first layer 200 causing an excitation of electrons in the intrinsic region 208. This generates an electric signal that can be measured to determine the intensity of the light passing through the waveguide 106. The distance between the waveguide 106 and the first surface of the first layer 200 may be about 0.2 microns to about 2.2 microns. FIGS. 2A and 2B are cross sectional views of the waveguide 106 and first layer 200 extends in direction into and out of the page.

FIG. 2B illustrates a cross-sectional view of an optical detector 103, according to one embodiment disclosed herein. The optical detector 103 depicted in FIG. 2B operates similarly to the optical detector 102 depicted in FIG. 2A. However, in FIG. 2B the waveguide 106 is deposited before the first layer positioned facing the second surface of the first layer 200. When light travels through the waveguide 106 energy is radiate through the material 214 and onto the second surface of the first layer 200. The distance between the waveguide 106 and the second surface of the first layer 200 may be about 0.2 microns to about 2.2 microns.

In one embodiment, the first layer 200 is formed by depositing a layer of polysilicon or amorphous silicon about 100-200 nm above or below the waveguide. In one embodiment, the first layer 200 is thermally annealed to partially crystallize the first layer 200. The first layer 200 is doped with n- and p-dopants to form diode structure. Contacts are also formed to the doped n and p regions as shown in FIG. 2. Lithographic patterning and etching of the first layer 200 is performed. An upper cladding layer is deposited to protect the first layer 200, contacts, and waveguide 106. Metal electrical contacts are formed for connection with external components.

Figure 3A:
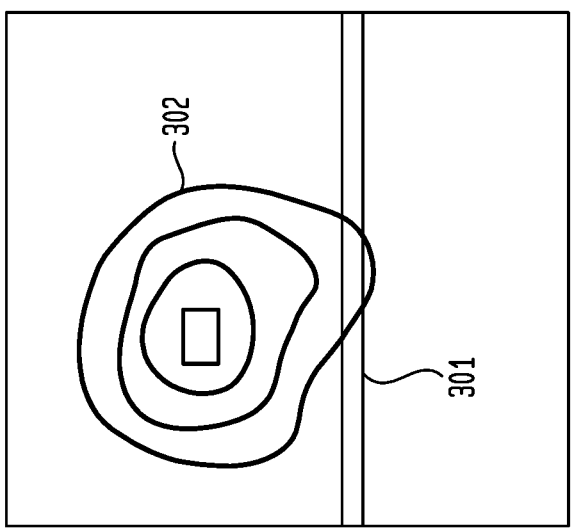
FIG. 3A illustrates a simulation of an optical signal traveling through a waveguide, according to one embodiment disclosed herein.
Figure 3B:
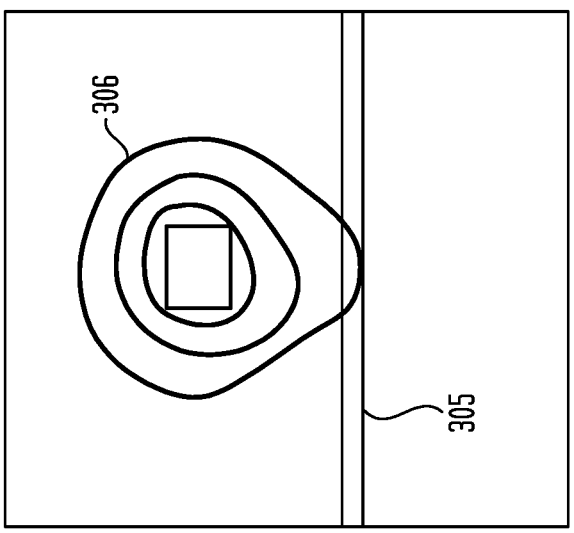
FIG. 3B illustrates a simulation of an optical signal traveling through a waveguide, according to one embodiment disclosed herein.
Figure 3C:
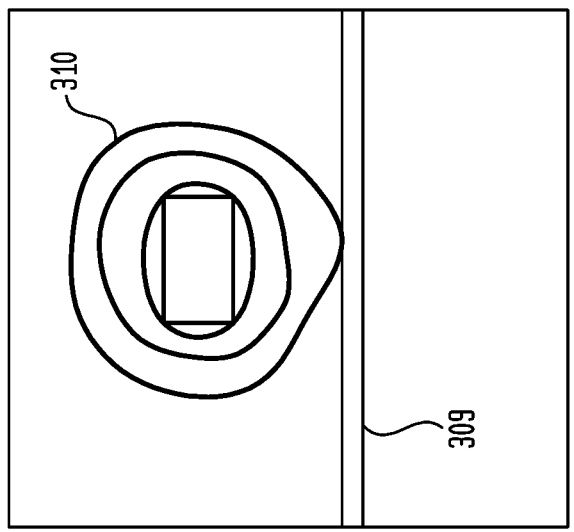
FIG. 3C illustrates a simulation of an optical signal traveling through a waveguide, according to one embodiment disclosed herein.

FIGS. 3A, 3B, and 3C depict simulations of an optical signal through a waveguide where each of the waveguides has different dimensions than the other waveguides depicted. Shading is used in FIGS. 3A, 3B and 3C to indicate the intensity of the optical signal is the greatest near the center of the waveguide. These figures also show that a silicon nitride waveguide that is wider and/or thicker will confine more light within the waveguide and provide radiation of less light to the polysilicon layer.

Changing the dimensions of the waveguide provides one way to tune the sensitivity of the detector 102 and how much energy the first layer 200 receives from the waveguide 106. In addition to changing the dimensions of the waveguide 106, the distance between the waveguide 106 and the first layer 200 can be changed to tune the sensitivity of the detector 102 and how much energy the detector 102 receives from the waveguide 106. For example, increasing the distance between the waveguide 106 and the first layer 200 reduces the sensitivity of the detector 102.

The sensitivity of the detector 102 can also be tuned by changing the location(s) of the dopant(s) on the first layer 200. For example, FIGS. 2A and 2B depicts the n-doped region on the left side of the first layer 200 and the p-doped region on the right side of the first layer 200. In one embodiment, the n-doped region can be moved further to the left side of the first layer 200 and/or the p-doped region and moved further to the right side of the first layer 200 to reduce the sensitivity/efficiency of the detector 102. In one embodiment, the location(s) of the dopants can be changed, the dimensions of the waveguide 106 can be changed, and/or the distance between the waveguide 106 and the first layer 200 can be changed to tune the detector 102. Further, the distance between the electrical contacts 104 can be moved either further apart or closer together to tune sensitivity. For example, the distance between the electrical contacts 104 can be about 2 microns to about 400 microns. The distance between the electrical contacts 104 may be kept far enough away from each other to avoid interacting with the optical field.

FIG. 3A depicts a simulation 300 that includes a silicon nitride waveguide 302 having a width of about 350 nm. The distance between the waveguide 106 and the first surface of the first layer 200 may be about 0.2 microns to about 2.2 microns. The shading in the simulation 300 illustrates that some of the optical signal has traveled outside (i.e., is not restricted within the waveguide 302) of the waveguide 302. Some of the energy from the optical signal that is outside of the waveguide 302 is detected and converted into an electrical signal by the first layer 301.

FIG. 3B depicts a simulation 304 that includes a waveguide 306. The waveguide 306 has a width of abut 500 nm and is greater than the width of waveguide 302. The simulation 304 shows that when compared to the simulation 300, more of the optical signal is within waveguide 306 than in the waveguide 302, and as a result, there is less energy from the optical signal that is outside of the waveguide 306 and available for detection by the first layer 305 than on the outside of the waveguide 302 and available to the first layer 301.

Likewise, FIG. 3C depicts a simulation 308 where waveguide 310 has a width of about 1000 nm and is wider than the waveguides 302 and 306. The waveguide 310 has more of the optical signal restricted to the waveguide 310 and less of the optical signal radiates towards the first layer 309 than towards first layer 301 and first layer 305. In short, increasing the width of the waveguide means that less of that optical signal radiates outside of the waveguide and towards the first layer. FIGS. 3A, 3B and 3C show that by changing the dimensions (i.e., the thickness 210 and/or the width 212) of the waveguide a different amount of light interacts with the first layer.

Figure 4:
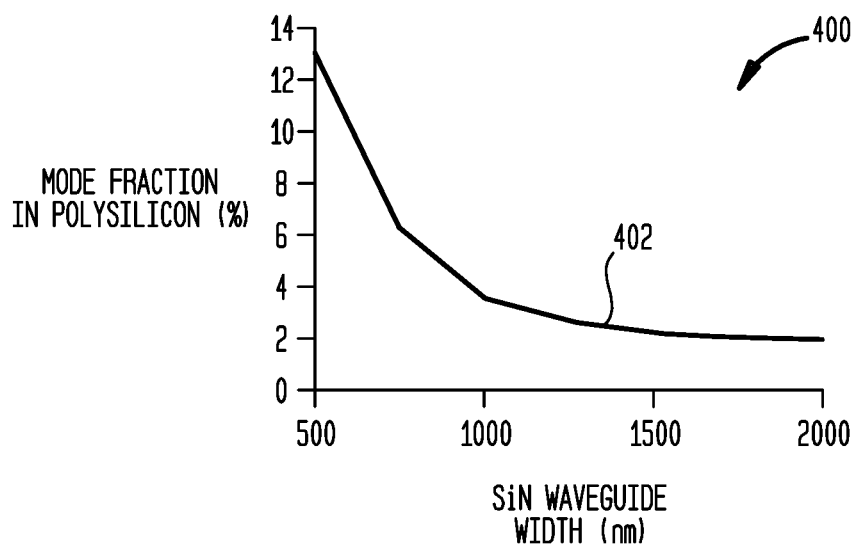
FIG. 4 illustrates an example graph that plots radiation received by a polysilicon layer for a waveguide having various widths.

FIG. 4 illustrates an example of a graph 400 that includes a plot 402 of radiation received by a first layer for a waveguide having various widths. For the graph 400, the first layer 200 has a width of about 120 nm. As shown by the X-axis, a range of about 500 nm to about 2000 nm is used as the width of the waveguide 106 to acquire plot 402. Plot 402 shows that as the width of the waveguide 106 increases the percentage of the optical signal that is received by the first layer 200 is reduced.

Figure 5:
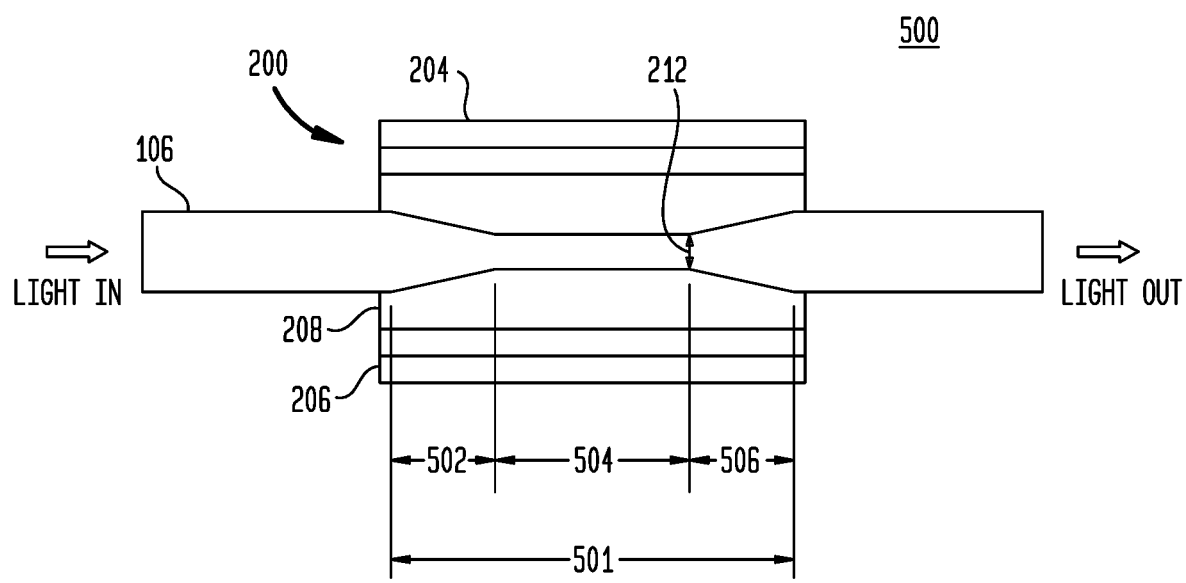
FIG. 5 illustrates one view of an optical detector, according to one embodiment disclosed herein.

FIG. 5 illustrates a top or bottom view of an optical detector 500 relative to the cross sectional views shown in FIGS. 2A and 2B, according to one embodiment disclosed herein. The waveguide 106 in FIG. 5 includes a portion 501 that is optically coupled to the first layer 200. In some embodiments, portion 501 has a length of about 100 microns to about 200 microns. Illustratively, the waveguide 106 is facing the intrinsic region 208 of the first layer 200. The portion 501 includes several subsections having different dimensions. For example, portion 501 includes subsections 502, 504 and 506. Subsection 502 is tapered so that the width dimension is smaller than before subsection 502. For example, the width of subsection 502 is tapered towards subsection 504. Subsection 504 proceeds from subsection 502 for a length "L" towards subsection 506. In this example, the width of the waveguide 106 in the subsection 504 is substantially constant. At subsection 506, the width of the waveguide 106 is increased until the width of the waveguide 106 is similar to the dimensions of the waveguide before subsection 502. Tapering the width at subsection 502 may cause more of the optical signal to radiate outside of the waveguide and into the intrinsic region 208 of the optical detector 500. As such, the subsections 502, 504 and 506 can increase the responsivity of the optical detector 500 relative to a waveguide that extends below the optical detector 500 without tapering.

Figure 6:
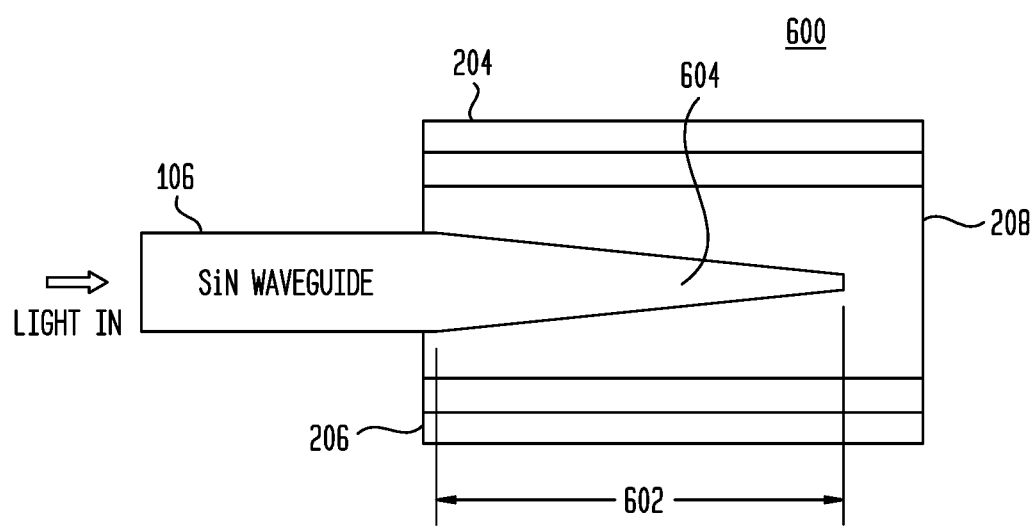
FIG. 6 illustrates one view of an optical detector, according to one embodiment disclosed herein.

FIG. 6 illustrates a top or bottom view of an optical detector 600 relative to the cross sectional views shown in FIGS. 2A and 2B, according to one embodiment disclosed herein. In FIG. 6, the waveguide 106 has a first portion 604 that tapers for a length 602 to one end and terminates underneath (or above) the first layer 200 (more specifically, the waveguide 106 terminates underneath (or above) the intrinsic region 208). The first portion 604 is disposed on a plane that is parallel to the first layer 200 (i.e., the diode). That is, the waveguide 106 does not extend beyond the two opposite ends of the detector 600. In this embodiment, tapering the waveguide 106 until it terminates may transmit more of the optical signal into the first layer 200 when compared to the optical detector 500 shown in FIG. 5. As examples, the optical detector 600 may be used to help with optical alignment and/or after a tap coupler. In one embodiment, the width 212 of the waveguide 106 is about 400 nm to about 4000 nm tapers at one end from about 0 to about 500 nm.

FIG. 8 illustrates a method 800 of operating an optical detector, according to one embodiment disclosed herein. The method 800 includes block 802 where an optical signal is transmitted through an optical waveguide 106 that is made of materials that include silicon and nitride (e.g., silicon nitride and silicon oxy-nitride). The waveguide 106 is optically coupled to a first layer 200. The first layer 200 is doped to form either a pn diode or a p-i-n diode. As the optical signal passes through the waveguide 106 some of that signal is received in the first layer 200. At block 804, the light received by the first layer 200 causes a corresponding electrical signal in the diode 102 that is measured.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. Apparatus comprising:
    an optical detector comprising a detection layer consisting of a doped material selected from a group consisting of doped polysilicon and doped amorphous silicon, wherein the doped material forms a diode, wherein the diode comprises a p-doped region and an n-doped region, wherein the detection layer comprises a first refractive index;
    a waveguide optically coupled to the diode and disposed on a different layer than the detection layer, wherein the waveguide comprises a second refractive index; and
    a material layer disposed between the detection layer and the waveguide, wherein the material layer comprises a third refractive index, wherein the third refractive index is different than the first refractive index and the second refractive index, wherein a portion of light energy traveling via the waveguide radiates through the material layer to the optical detector.

2. The apparatus of claim 1 wherein the waveguide is formed from one of silicon, silicon nitride, silicon oxy-nitride, amorphous silicon, a polymer, and polysilicon.

3. The apparatus of claim 1 wherein the n-doped region is disposed on a first end of the detection layer and the p-doped region is disposed on a second, opposite end of the detection layer.

4. The apparatus of claim 1 wherein the detection layer comprises:
    a first surface;
    a first electrical contact contacts the first surface in the p-doped region; and
    a second electrical contact contacts the first surface in the n-doped region, wherein the waveguide is in a facing relationship with the first surface and is disposed between the first electrical contact and the second electrical contact.

5. The apparatus of claim 1 wherein the detection layer comprises an intrinsic region disposed between the n-doped and p-doped regions diode, wherein the waveguide is disposed on an axis that extends through the intrinsic region and is perpendicular to the detection layer.

6. The apparatus of claim 5 wherein the detection layer comprises:
    a first surface; and
    a second surface that is opposite to the first surface, wherein a first electrical contact contacts the first surface in the p-doped region and a second electrical contact contacts the first surface in the n-doped region, and wherein the waveguide is in a facing relationship with a portion of the second surface that includes the intrinsic region.

7. The apparatus of claim 1 wherein the detection layer comprises:
    a first surface; and
    a second surface that is opposite to the first surface, wherein a first electrical contact contacts to the first surface in the p-doped region and a second electrical contact contacts the first surface in the n-doped region, and wherein the waveguide is in a facing relationship with the second surface.

8. The apparatus of claim 1 wherein the waveguide includes a first portion that is adapted to transmit an optical signal to the diode, the first portion comprising at least one dimension that tapers along a direction that is substantially parallel to the detection layer, wherein the waveguide terminates at an end of the first portion, wherein the end of the first portion is disposed on a plane that intersects the diode.

9. The apparatus of claim 1 wherein the waveguide includes a first portion that is adapted to transmit an optical signal to the diode, the first portion includes at least one dimension that tapers until reaching a second portion of the waveguide that does not taper, wherein the waveguide comprises a third portion connected to the second portion, wherein the third portion has a reverse taper relative to the first portion.

10. An interposer comprising:
    an optical detector comprising a detection layer consisting of a first doped material selected from a group consisting of doped polysilicon and doped amorphous silicon, wherein the first doped material forms a diode, wherein the detection layer comprises a first refractive index;
    a waveguide optically coupled to the diode and disposed on a different layer than the detection layer, the waveguide is made of a second material that comprises one of silicon nitride and silicon oxy-nitride, wherein the waveguide comprises a second refractive index; and
    a material layer disposed between the detection layer and the waveguide, wherein the material layer comprises a third refractive index, wherein the third refractive index is different than the first refractive index and the second refractive index, wherein a portion of light energy traveling via the waveguide radiates through the material layer to the optical detector.

11. The interposer of claim 10 wherein the detection layer is one of a polysilicon semiconductor layer and an amorphous semiconductor layer, the detection layer includes an n-doped region is disposed on a first end of the detection layer and a p-doped region is disposed on a second, opposite end of the detection layer.

12. The interposer of claim 11 wherein the detection layer includes a first surface, a first electrical contact connected to the first surface in the p-doped region, a second electrical contact connected to the first surface in the n-doped region, and the waveguide is facing the first surface and is positioned to radiate energy on the first surface and is disposed between the first and second electrical contacts.

13. The interposer of claim 11 wherein the detection layer includes a first surface and a second surface that is opposite to the first surface, a first electrical contact connected to the first surface in the p-doped region, a second electrical contact connected to the first surface in the n-doped region, and the waveguide is facing the second surface and is positioned to radiate energy on the second surface.

14. The interposer of claim 11 wherein the waveguide includes a first portion that is adapted to radiate energy on a surface of the detection layer, the first portion includes at least one dimension that tapers towards a terminating end of the waveguide as the first portion extends to the terminating end in a direction that is substantially parallel to an axis that extends through the p-doped region and is perpendicular to the detection layer.

15. The interposer of claim 10 wherein the waveguide includes a first portion that radiates energy onto a surface of the detection layer, the first portion includes at least one dimension that tapers to one end of a second portion that radiates energy onto the surface of the detection layer and a third portion that extends from an opposite end of the second portion, the third portion radiates energy onto the surface of the detection layer and increases in size the at least one dimension that was tapered in the tapered section.

\* \* \* \* \*